United States Patent [19]

Mattelin

[11] Patent Number: 4,564,739
[45] Date of Patent: Jan. 14, 1986

[54] APPARATUS FOR LABELING PARTS WITH A LASER

[75] Inventor: Antoon Mattelin, Oostkamp, Belgium

[73] Assignee: Siemens Aktiengesellschaft, Berlin & Munich, Fed. Rep. of Germany

[21] Appl. No.: 630,673

[22] Filed: Jul. 13, 1984

[30] Foreign Application Priority Data

Sep. 15, 1983 [DE] Fed. Rep. of Germany ....... 3333386

[51] Int. Cl.⁴ ............................................. B23K 26/06
[52] U.S. Cl. ..................... 219/121 LH; 219/121 LQ; 219/121 LR; 219/121 LT; 219/121 LU
[58] Field of Search .................. 219/121 LH, 121 LJ, 219/121 LS, 121 LT, 121 LP, 121 LQ, 121 LR, 121 LU, 121 LY; 364/474, 475; 346/76 L

[56] References Cited

U.S. PATENT DOCUMENTS 3,622,740 11/1971 Ravussin ................. 219/121 LV X
4,304,981 12/1981 Gappa ....................... 219/121 LJ X
4,307,282 12/1981 Gappa ....................... 219/121 LH X

*Primary Examiner*—C. L. Albritton
*Assistant Examiner*—Alfred S. Keve
*Attorney, Agent, or Firm*—Hill, Van Santen, Steadman & Simpson

[57] ABSTRACT

A method and apparatus for simultaneously labeling or inscribing two parts by using a laser beam, characterized by a beam from a laser being subdivided into two sub-beams which are guided to a deflection optic system with different angles of incidence so that the deflected sub-beams when focused on a work surface are laterally displaced to enable inscribing or labeling two parts.

8 Claims, 2 Drawing Figures

APPARATUS FOR LABELING PARTS WITH A LASER

BACKGROUND OF THE INVENTION

The present invention is directed to a method and apparatus for labeling or inscribing parts by moving a focused laser beam on a surface of the part. In particular, the method and apparatus are directed to enabling simultaneous labeling of at least two parts by subdividing the laser beam into at least two sub-beams which are directed onto a work surface at spaced intervals to enable labeling the two parts at the same time.

A method and apparatus are disclosed in copending U.S. patent application Ser. No. 435,690, filed October 21, 1982, now U.S. Pat. No. 4,539,481, which was based on German OS 31 47 355 and whose disclosure is incorporated by reference thereto. In this application, a laser beam is passed through a photographic shutter and then through a deflecting optical arrangement and is focused on a surface of a part which is to be labeled. The photographic shutter and the deflecting optical system are both controlled by a process control computer in accordance with the particular labeling job. The part, which is disposed on a work surface of the work table, must thereby be precisely aligned relative to a reference system of the laser so that the title block assumes the intended position on the part to be labeled. Parts consisting of metal, ceramic, semiconductor materials and a multitude of synthetic materials can be labeled with the laser printing letters, numerals, marks, company logos or graphic representations in accordance with the labeling task. The labeling can be executed either by engraving lettering, by fusion lettering or by evaporation lettering. Since the surface of the part to be labeled must be permanently altered at the point on which the laser beam impinges, the speed with which the labeling of the part can be executed is restricted. On the other hand, particularly given mass production of parts such as, for example, in the case of electronic components there is a need to label as many parts as possible in the shortest possible time.

SUMMARY OF THE INVENTION

The present invention is directed to providing a method and apparatus for labeling parts, particularly electronic components, with an increased rate of speed.

To accomplish these goals, the invention is directed to an improvement in a method of labeling a surface of a part particularly an electronic component, said method comprising the steps of focusing a laser beam onto the surface of the part which is positioned on a work surface and deflecting the focused beam by deflection optics which are controllable in accordance with a labeling job to guide the beam on a desired labeling path. The improvement comprises positioning at least two parts adjacent each other on the work surface, subdividing the laser beam into at least two sub-beams and guiding the two sub-beams onto the deflection optics with the angle of incidence of each beam being different to produce an offset between the beams at the work surface to label at least two parts simultaneously.

The invention is also directed to an improved apparatus which enables practicing the method. The improvement is to an apparatus which has a laser for generating a laser beam, deflective means including a deflection optics disposed in the beam path of the laser and being controllable in accordance with the labeling job, means for controlling the deflective means, and then means disposed in a position following the deflective means for focusing the laser beam onto a surface of a part disposed on a work surface of the apparatus. The improvements comprise beam splitting means including at least one beam splitter being disposed between the laser and the deflective means for dividing the laser beam into at least two sub-beams, and means for guiding each of the sub-beams onto the deflection means with an angle of incidence different than the angle of incidence of the other sub-beam so that the focused sub-beams are spaced apart to simultaneously label at least two parts disposed on the work surface.

The invention is based on the perception that only a relatively slight increase in the speed of labeling can be achieved with justifiable increase in cost given the known and technical mature laser labeling apparatus. An economic solution to the problem, which can be achieved with little increase in expense occurs however by means of dividing the laser beam into at least two sub-beams which are then deflected simultaneously by the deflecting means with different angles of incidence which enable simultaneous labeling of at least two parts. A doubling of the printing or labeling performance is thus achieved given a division of the laser beam into two sub-beams and a labeling of the parts in pairs. To this end, a beam splitter need merely be inserted into the beam path of the laser between the laser and the deflective means and additional deviating means for guiding one of the beams onto the deflection means with a different angle of incidence from the other beam.

The beam splitter can be a partially reflecting mirror. Given labeling of a pair of parts, a semi-reflecting mirror is preferably employed as the beam splitter and allows equal power of the two sub-beams. Thus, uniform labeling of all parts will occur.

Given a preferred development of the invention, one sub-beam continues to proceed in the direction of the laser beam onto the deflection optics whereas the other sub-beam can be guided onto the deflection optics via a deviating means. Only a single deviating means is thus required for labeling the pair of parts simultaneously.

According to another preferred development of the invention, the deviating means can be set to the spacing of the title blocks or areas of the two parts disposed on the work surface. In this manner, the sub-beams can be easily adjusted to a new spacing between title blocks of two parts to be labeled given a change of the particular batch of parts. A passive reflector is preferably employed as the deviating means. When a rotatable passive reflector is employed as the deviating means, then the adjustment to the spacing of the title blocks of the two parts disposed on the work surface can be undertaken by means of turning the passive reflector and by means of a corresponding adjustment of the deflection optics. The deviating means, however, can also be designed as a passive reflector that is mounted for rotation on an axis and can be the axis displaced relative to the beam splitter so that the adjustment to the spacing of the title blocks of the two parts disposed on the work surface is then undertaken by means of a corresponding rotation and displacement of the passive reflector. An adjustment or, respectively, compensation of the deflection optics can be eliminated.

Finally, the deflection optics preferably consist of two deflecting mirrors that are inserted into the beam paths of the sub-beams and are rotated on different axes that extend at right angles to each other. Thus, each of the sub-beams can be moved in both an x and y direction on the surface of the workpiece.

DESCRIPTION OF THE PREFERRED EMBODIMENTS

Figure 1:
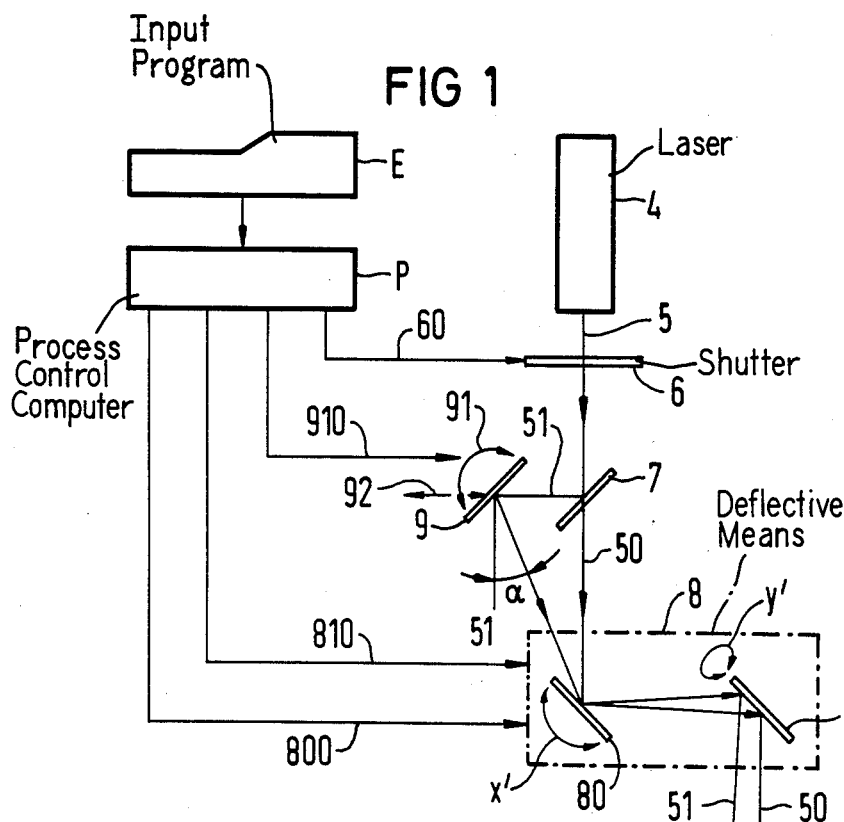
FIG. 1 is a diagrammatic illustration of a device in accordance with the present invention.

The principles of the present invention are particularly useful when incorporated in apparatus which is diagrammatically illustrated in FIG. 1. The apparatus of FIG. 1 will simultaneously label two parts 2 and 3 which are disposed on a work surface or support 1. The apparatus comprises a laser 4 which generates a laser beam 5. A photographic shutter 6 is disposed in the path of the laser beam 5 and a beam splitter 7 is positioned in the path of the beam 5 following the shutter 6. The beam splitter 7 preferably is a half-silvered mirror which allows one part of the laser beam 5 to pass and reflects the other part. The beam splitter 7 thus divides the laser beam 5 into a first sub-beam 50 and into a second, reflected sub-beam 51. Due to the selection of the half-silvered mirror, the power of the two sub-beams 50 and 51, respectively, amount to approximately to 50% of the power of the laser beam 5 before the splitting occurs.

Figure 2:
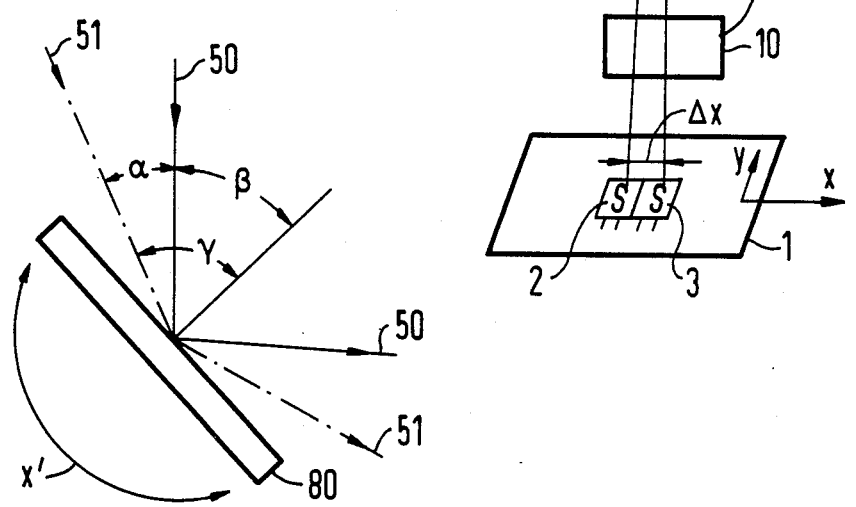
FIG. 2 is an enlarged diagrammatic view of the deflection optics of the apparatus with different angles of incidence of the two sub-beams.

The first sub-beam 5 passes through the beam splitter 7 and impinges directly onto a first rotatable deflecting mirror 80 of a deflection optics that forms the deflective means 8. The second reflected sub-beam 51 is indirectly guided onto the first deflecting mirror 80 by a deviating means 9. The deviating means 9 includes means for mounting the passive reflector for rotation on an axis as indicated by double arrow 91 and for displacing the axis in the direction of double arrow 92 relative to the beam splitter 7. By means of rotating and dislocating or displacing the deviating means 9, the angle $\alpha$ on which the second sub-beam 51 is guided or directed at the first deflecting mirror 80 relative to a vertical line and thus to the first sub-beam 50 can be changed. It can thereby be seen from the illustration in FIG. 2 that the angle of incidence of the first sub-beam 50 is an angle $\beta$ and the angle of incidence of the second sub-beam 51 shown in dot-dash lines is an angle $\gamma$. It is also seen that the relationship of angle $\alpha$ to the value of angle $\gamma$ and angle $\beta$ is according to the formula $\beta = \gamma - \beta$.

The position of the two parts 2 and 3 on the work surface 1 is fixed with reference to a planar Cartesian coordinate system and thus in the x and y direction. Accordingly, the first rotatable deflecting mirror 80 of the deflection means or optics 8 has the task of deflecting the two sub-beams 50 and 51 in a horizontal direction x, which deflection is illustrated by the double arrow x'. The second rotatable deflecting mirror 81 of the deflection optics 8 has the task of deflecting two sub-beams 50 and 51 in a vertical direction y and this is indicated by means of the double arrow y'. After passing through the deflection optics 8, the two sub-beams 50 and 51 are then focused on the surface of the allocated or selected parts 3 and 2, respectively, by means of a lens system 10 which forms the lens means. If the parts are capacitors, they will have an approximately square area that is 1 cm on a side.

The spacing of the title blocks of each of the parts 2 and 3 disposed on the work surface 1 is referenced $\Delta x$. This spacing $\Delta x$ must then likewise be guaranteed between the two sub-beams 50 and 51 at the level of the surface of the parts 2 and 3. Since the spacing $\Delta x$ can, however, vary with the geometry of the parts which are to be labeled, the apparatus must be capable of being matched to the respective given conditions.

This matching occurs via the above mentioned adjustability of the deviating means 9. By adjusting the deviating means 9 in the direction of the double arrows 91 and 92, the angle $\alpha$ which corresponds to the angle between the beams 50 and 51 can be set to produce the required spacing $\Delta x$ so that the relationship between $\Delta x$ and angle $\alpha$ can be derived without further ado from the laws of geometrical optics.

The control of the deflection mirrors 80 and 81 of the deflection optics 8 is in accordance with the respective labeling job which occurs by means of a process control computer P which receives an input program E. The lines for controlling the deflecting mirrors 80 and 81 are thus illustrated as lines 800 and 810. The process control computer P also controls the photographic shutter 6 and this is shown by means of a control line 60. In addition, the computer P can assume adjustment of the spacing $\Delta x$ by means of controlling the deviating means 9 through a corresponding control line such as 910.

It should be noted that the computer such as P and the input program E are both conventional and known in the prior art.

The described apparatus enables laser labeling of parts arranged in pairs. This produces a doubling of the printing performance in comparison to the traditional devices. The added expense in comparison to the prior known devices used for labeling is only slightly increased. In many uses such as, for example, labeling lacquer parts or parts consisting of a synthetic material, the laser heretofore employed can be retained since this power is still adequate for labeling even given a beam splitting that occurs in applicant's improvement.

Although various minor modifications may be suggested by those versed in the art, it should be understood that I wish to embody within the scope of the patent granted hereon, all such modifications as reasonably and properly come within the scope of my contribution to the art.

I claim:

1. In an apparatus for labeling parts, particularly electronic components, said apparatus comprising a laser for creating a laser beam, deflective means for deflecting the laser beam in at least two directions, said deflective means including deflection optics disposed in the beam path of the laser and being controllable in accordance with the labeling job, means for controlling the deflective means, and lens means disposed on the beam path after the deflection optics for focusing the laser beam onto the surface of the part disposed on a work surface of the apparatus, the improvements comprising beam splitter means being disposed in the beam path of the laser for dividing the beam into at least two sub-beams prior to being received by the deflective means, said deflection optics consisting of two deflecting mirrors which are positioned successively in the beam path, each of said mirrors being mounted for rotation about an axis with the axis of one mirror being at right angles to the axis of the other mirror, and means for guiding said sub-beams to the deflective means with a different angle of incidence for each of the sub-beams with respect to the deflective means so that the lens means focuses the sub-beams onto spaced positions to enable labeling at least two parts simultaneously.

2. In an apparatus according to claim 1, wherein the beam splitter means is a semi-reflecting mirror.

3. In an apparatus according to claim 2, wherein the beam splitter means is a half-silvered mirror.

4. In an apparatus according to claim 1, wherein the means for guiding the sub-beam guides one sub-beam directly onto the deflection optics of the deflective means and in the general direction of the laser beam and wherein the means for guiding includes deviating means for guiding the other sub-beam at an angle to the one sub-beam.

5. In an apparatus according to claim 4, wherein the deviating means is adjustable to enable changing the spacing between the two focused sub-beams at the work surface.

6. In an apparatus according to claim 4, wherein the deviating means is a passive reflector.

7. In an apparatus according to claim 6, wherein the deviating means includes means to mount the passive reflector for rotation on an axis.

8. In an apparatus according to claim 6, wherein the deviating means include means for mounting the passive reflector for rotation on an axis and for displacing the axis relative to the beam splitter means.

* * * * *